United States Patent
Marreiro et al.

(10) Patent No.: US 10,217,733 B2
(45) Date of Patent: Feb. 26, 2019

(54) FAST SCR STRUCTURE FOR ESD PROTECTION

(71) Applicant: SEMICONDUCTOR COMPONENTS INDUSTRIES, LLC, Phoenix, AZ (US)

(72) Inventors: David D. Marreiro, Oakland, CA (US); Yupeng Chen, San Jose, CA (US); Steven M. Etter, Phoenix, AZ (US); Umesh Sharma, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 316 days.

(21) Appl. No.: 15/251,910

(22) Filed: Aug. 30, 2016

(65) Prior Publication Data
US 2017/0077082 A1    Mar. 16, 2017

Related U.S. Application Data

(60) Provisional application No. 62/219,119, filed on Sep. 15, 2015.

(51) Int. Cl.
*H01L 27/02* (2006.01)
*H01L 29/06* (2006.01)
*H01L 29/866* (2006.01)

(52) U.S. Cl.
CPC ...... *H01L 27/0262* (2013.01); *H01L 27/0255* (2013.01); *H01L 29/0688* (2013.01); *H01L 29/866* (2013.01)

(58) Field of Classification Search
CPC ............ H01L 27/0262; H01L 27/0255; H01L 29/0688; H01L 29/866
See application file for complete search history.

(56) References Cited

U.S. PATENT DOCUMENTS

| | | |
|---|---|---|
| 3,882,529 A | 5/1975 | Warner, Jr. |
| 4,819,052 A | 4/1989 | Hutter |
| 5,155,562 A | 10/1992 | Tsuchiya |
| 5,500,546 A | 3/1996 | Marum et al. |
| 5,850,095 A | 12/1998 | Chen et al. |
| 5,872,379 A | 2/1999 | Lee |

(Continued)

*Primary Examiner* — Zeev V Kitov
(74) *Attorney, Agent, or Firm* — Ramey & Schwaller, LLP

(57) ABSTRACT

An ultra-low capacitance ESD protection device with an ultra-fast response time and a low turn-on voltage, and a high holding current. The device may include: a heavily-doped p-type substrate; a lightly-doped n-type epitaxial layer with a heavily-doped n-type buried layer; and a semiconductor-controlled rectifier (SCR) structure within the epitaxial layer. The SCR structure includes, between a ground terminal and a pad terminal: a shallow P+ region within a moderately-doped n-type well to form an emitter-base junction of a trigger transistor; a shallow N+ region within a moderately-doped p-type well to form an emitter-base junction of a latching transistor, and a PN junction coupled to either of the shallow regions as a forward-biased series diode. To reduce capacitance, the n-type and p-type wells are separated by a lightly-doped portion of the epitaxial layer having a small lateral dimension for enhanced switching speed.

19 Claims, 4 Drawing Sheets

(56) References Cited

U.S. PATENT DOCUMENTS

| | | |
|---|---|---|
| 5,939,755 A * | 8/1999 | Takeuchi ............ H01L 27/1203 257/347 |
| 6,015,999 A | 1/2000 | Yu et al. |
| 6,373,100 B1 | 4/2002 | Pages et al. |
| 6,448,123 B1 | 9/2002 | Lee et al. |
| 6,489,660 B1 | 12/2002 | Einthoven et al. |
| 6,909,149 B2 | 6/2005 | Russ et al. |
| 6,914,298 B1 | 7/2005 | Hamazawa |
| 7,538,395 B2 | 5/2009 | Keena et al. |
| 7,579,632 B2 | 8/2009 | Salih et al. |
| 7,666,751 B2 | 2/2010 | Marreiro et al. |
| 7,781,826 B2 | 8/2010 | Mallikararjunaswamy et al. |
| 7,812,367 B2 | 10/2010 | Salin et al. |
| 7,842,969 B2 | 11/2010 | Marreiro et al. |
| 7,968,936 B2 * | 6/2011 | Denison ............. H01L 27/0262 257/170 |
| 8,039,359 B2 | 10/2011 | Keena et al. |
| 8,236,625 B2 | 8/2012 | Salih et al. |
| 8,274,130 B2 | 9/2012 | Mihnea et al. |
| 8,796,731 B2 | 8/2014 | Abou-Khalil et al. |
| 9,337,178 B2 | 5/2016 | Marreiro et al. |
| 2005/0145945 A1 | 7/2005 | Zdebel et al. |
| 2005/0212051 A1 | 9/2005 | Jozwiak et al. |
| 2008/0088993 A1 * | 4/2008 | Entringer ............ H01L 27/0262 361/56 |
| 2010/0219463 A1 | 9/2010 | Cheng et al. |
| 2010/0244090 A1 | 9/2010 | Bobde et al. |
| 2010/0314660 A1 | 12/2010 | Salih et al. |
| 2011/0127602 A1 | 6/2011 | Mallikarjunaswamy |
| 2011/0176244 A1 | 7/2011 | Gendron et al. |
| 2011/0210418 A1 | 9/2011 | Esmark |
| 2012/0168900 A1 | 7/2012 | Bobde |
| 2013/0093057 A1 | 4/2013 | Yamaoka |
| 2013/0328103 A1 * | 12/2013 | Salcedo ............. H01L 27/0262 257/121 |
| 2014/0159108 A1 * | 6/2014 | Marreiro ............ H01L 27/0248 257/140 |

* cited by examiner

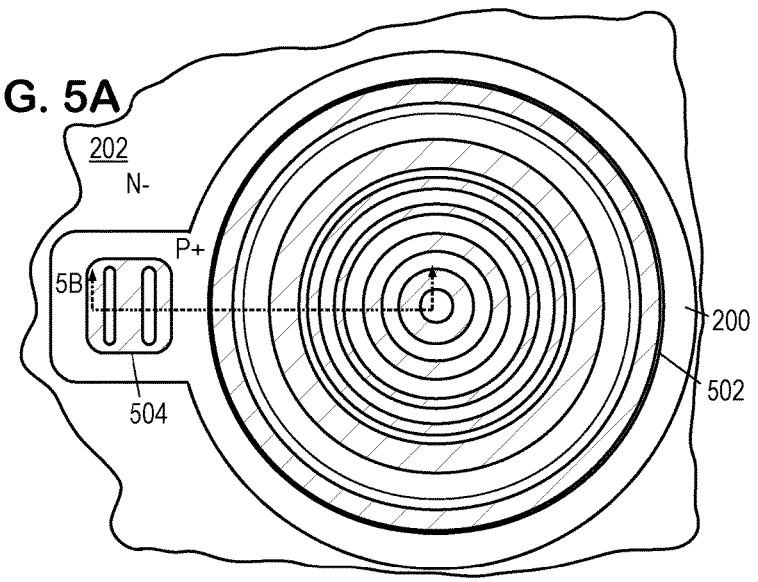
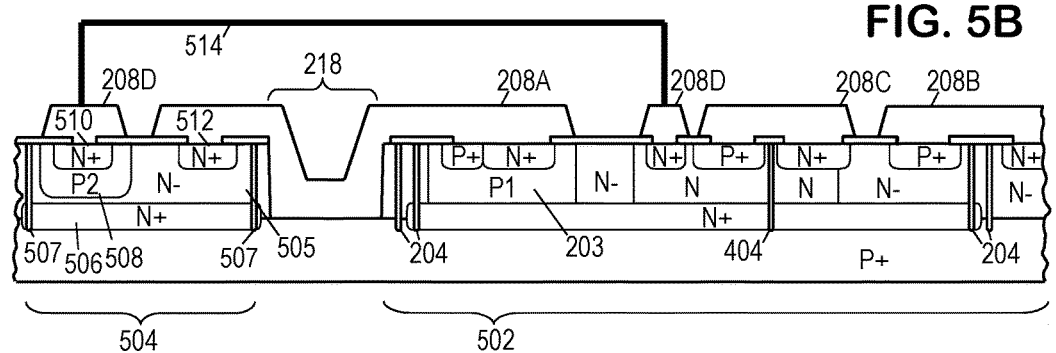
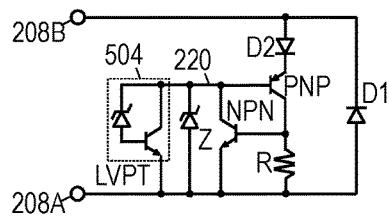
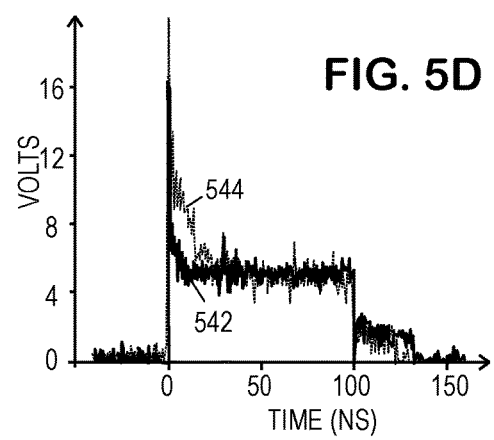

FAST SCR STRUCTURE FOR ESD PROTECTION

CROSS-REFERENCE TO RELATED APPLICATIONS

The present application claims priority to Provisional US Application 62/219,119, filed 2015 Sep. 15, and titled "Semiconductor Devices and Methods" by inventors David Marreiro, Yupeng Chen, Steven M. Etter, and Umesh Sharma, and which is hereby incorporated herein by reference.

BACKGROUND

When a charged object is brought into close proximity to an uncharged or oppositely charged device, an electrostatic discharge (ESD) often occurs, particularly if the device includes conductive elements. As the excess charge carriers begin to flow from the charged object to the device, they induce a breakdown of the intervening dielectric, reducing resistance for ensuing carrier flow and enabling a charge equalization to occur on a very short time scale, e.g., 100 ns. At this time scale, a relatively modest discharge can nevertheless present current and voltage levels well in excess of the capabilities of most solid-state electronics.

For example, modern transceivers for high-speed serial data interfaces (e.g., USB 3.0/3.1, HDMI 1.3/1.4, which support data rates above 10 Gbps) are built with small geometry processes that are extremely sensitive to ESD. ESD damage is likely to occur if such transceivers are exposed to excessive voltage for more than 5 ns. Conventional low-voltage clamping structures such as a Silicon- (or Semiconductor-) Controlled Rectifier (SCR) provide a delayed clamping response or require a high trigger voltage that risks damage to sensitive protected devices. Where such low-voltage clamping structures provide a low holding current, they may also be susceptible to latch-up faults. Other existing ESD protection structures, if designed with low enough capacitance and insertion loss to maintain data integrity for the high-speed serial data interfaces, struggle to shed the excessive voltage quickly enough.

SUMMARY

Accordingly, there is provided herein various embodiments of an ultra-low capacitance device providing an ultra-fast response time to ESD with a low turn-on voltage, a low voltage clamp, and a high holding current. To paraphrase the language of the claims, at least some illustrative embodiments of the device include: a substrate, the substrate being a heavily-doped semiconductor of a first conductivity type; a lightly-doped epitaxial layer on the substrate with an intervening heavily-doped buried layer in at least one region, the epitaxial layer and buried layer having a second conductivity type different than the first; and a semiconductor-controlled rectifier (SCR) structure within said at least one region. The SCR structure includes, between a ground terminal and a pad terminal: a first shallow region heavily-doped to be of the first conductivity type within a first well moderately-doped to be of the second conductivity type, the first shallow region and first well forming an emitter-base junction of a trigger transistor; a second shallow region heavily-doped to be of the second conductivity type within a second well moderately-doped to be of the first conductivity type, the second shallow region and second well forming an emitter-base junction of a latching transistor, wherein the first and second wells are separated by a lightly-doped portion of the epitaxial layer; and a PN junction coupled to either the first or second shallow region as a forward-biased series diode.

At least some illustrative embodiments of a method for protecting a signal or supply line against damage from ESD include: providing a reverse-biased diode that conducts if the line voltage falls below a ground terminal voltage; and providing an SCR structure that remains OFF until the line voltage exceeds a trigger voltage at which point it switches ON to clamp the line voltage at a snapback voltage below the trigger voltage, resetting only after the line current falls below a holding current or the line voltage falls below a holding voltage. The SCR structure provides a fast switching response with an ultra-low input capacitance and elevated holding voltage by way of a forward-biased diode in series with: a first shallow region heavily-doped to be of a first conductivity type within a first well moderately-doped to be of the second conductivity type, the first shallow region and first well forming an emitter-base junction of a trigger transistor; a second shallow region heavily-doped to be of the second conductivity type within a second well moderately-doped to be of the first conductivity type, the second shallow region and second well forming an emitter-base junction of a latching transistor; and an interposed epitaxial layer region lightly-doped to be of the first or second conductivity type and having a length of no more than five micrometers.

Each of the foregoing embodiments may be implemented individually or in combination and may include one or more of the following features in any compatible combination: (1) the at least one region is laterally bounded by one or more isolation trenches that extend through the buried layer to reach the substrate. (2) a junction between the buried layer and the substrate serves as a first Zener diode reverse-biased between the base of the trigger transistor and the substrate. (3) the PN junction of the series diode is formed by a third shallow region heavily-doped to be of the first conductivity type within a second portion of the epitaxial layer, the third shallow region being connected to the pad terminal. (4) the second portion of the epitaxial layer is coupled to the first shallow region by a conductive trace between the first shallow region and a fourth shallow region heavily doped to be of the second conductivity type. (5) an isolation trench between the first shallow region and the fourth shallow region, the isolation trench extending through the first well and the buried layer to reach the substrate. (6) the SCR structure further includes a fifth shallow region heavily doped to be of the second conductivity type within the first well to serve as a trigger node. (7) the trigger node is coupled to a trigger element. (8) the trigger element comprises a low-voltage punch-through (LVPT) device coupled between the trigger node and the ground terminal. (9) the trigger element comprises a second Zener diode having a breakdown voltage smaller than that of the first Zener diode. (10) the trigger element is formed within a separate region of the lightly-doped epitaxial layer having an intervening buried layer with the substrate and bounded by one or more isolation trenches that extend through the buried layer to the substrate. (11) the SCR structure further includes a third well moderately-doped to be of the first conductivity type, the third well interposed between the second well and the lightly-doped portion of the epitaxial layer to enhance a holding current of the device. (12) the first conductivity type is p-type and second conductivity type is n-type. (13) the first conductivity type is n-type and second conductivity type is p-type. (14) the interposed epitaxial layer region has a length of less than two micrometers. (15) the method further includes providing an integrated trigger element with the SCR structure, the trigger element being coupled to a fifth shallow region heavily doped to be of the second conductivity type within the first well to provide a reduced trigger voltage.

BRIEF DESCRIPTION OF THE DRAWINGS

In the drawings:

FIGS. 5A-5D are a plan view, a cross-section, an equivalent circuit, and a response curve comparison for a second ESD protection device embodiment.

Figure 1:
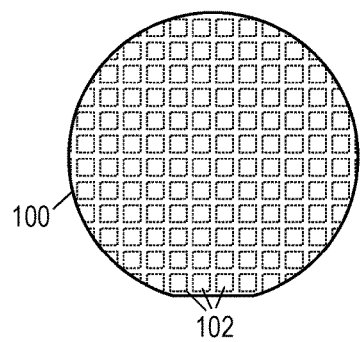
FIG. 1A shows an illustrative patterned semiconductor wafer.

For clarity, the figures are not necessarily drawn to scale, and some of the elements may be exaggerated for illustrative purposes. Moreover, the figures often show the doped regions of device structures as having precise, idealized boundaries for illustrative purposes, but those skilled in the art will recognize that these regions are formed via the diffusion and activation of dopants, and accordingly may have imprecise, gradual transitions that, while being less than ideal, nevertheless provide the desired functionality.

Unless otherwise indicated below, the same reference numbers in different figures denote the same elements or elements of the same kind. Note that the drawings and corresponding detailed description do not limit the disclosure, but on the contrary, they provide the foundation for understanding all modifications, equivalents, and alternatives falling within the scope of the appended claims.

Terminology

The terms "approximately" or "substantially" indicate that an attribute or parameter value is expected to be close to a specified state or number, but that there may be some reasonable variance that would not affect the relevant operating principles of the disclosure. Unless otherwise stated, variances of up to 10% (or in the context of a logarithmic scale, variances of up to a factor of 4) are understood to be reasonable.

The term "conductivity type" refers to the primary mechanism through which current flow occurs in a doped semiconductor, i.e., whether it occurs through motion of holes in the valence band (P-type) or through motion of electrons in the conduction band (N-type). Those skilled in the art will recognize that where such terms are employed in the following description, complementary devices may be obtained by interchanging the conductivity types.

In the following description, the terms "intrinsic", "lightly-doped", "moderately-doped", and "heavily-doped", and "degenerate" are employed to indicate relative degrees of doping. These terms are not intended to indicate definitive numerical ranges, but rather to indicate (on a logarithmic scale) approximate ranges whose upper and lower extremes may be allowed to vary by a factor of 4 in either direction. (So long as the relative concentrations of different device regions are maintained, the operating principles may be expected to remain unchanged, albeit with adjusted resistivities, threshold voltages, and current densities.)

In the context of silicon, the term "intrinsic" indicates a dopant concentration of $10^{14}$ atoms/cm$^3$ or less. "Lightly-doped" indicates a concentration in the range between $10^{14}$ and $10^{16}$ atoms/cm$^3$. "Moderately-doped" indicates a concentration in the range $10^{16}$ to $10^{18}$ atoms/cm$^3$ inclusive. "Heavily-doped" indicates a concentration in the range $10^{18}$ to $10^{20}$ atoms/cm$^3$. "Degenerate" indicates a doping level sufficient to provide an ohmic (non-rectifying) connection with a metal contact (generally greater than $10^{20}$ atoms/cm$^3$). Note that for semiconductors other than silicon, these ranges may vary.

In the context of circuit and device operation, the words "during", "while", and "when", as used herein are not intended to indicate instantaneous effect, but rather should be taken as allowing for some small but reasonable propagation delay.

If used herein, the terms "first", "second", "third", and the like, refer only to the order of presentation in the specification or claims, and do not inherently indicate any required arrangement, ranking, or sequence. Rather, such terms should be regarded as the interchangeable names of similar items.

DETAILED DESCRIPTION

The manufacturing of semiconductor devices begins with a wafer cut from a semiconductor crystal. The wafer serves as a substrate 100 to which a sequence of operations is applied. Each of the individual operations in the sequence described herein are generally well understood and documented in the open literature, and may include cleaning, etching, deposition, masking, implantation, diffusion, oxidation, metallization, and passivation. The precise order (and parameters) of the operations and patterning of the masks determine the structure of the resulting semiconductor device. As each device typically occupies only a small portion (a block or "die") of the substrate 100, the operations may be designed to create many semiconductor devices 102 at the same time, as shown in FIG. 1. Once the sequence of processing operations is complete, the individual semiconductor devices 102 may be tested and cut apart ("singulated"). The singulated dies are then packaged to provide solderable leads or contacts that enable the devices 102 to be easily incorporated into electronic circuitry.

Figure 2A:
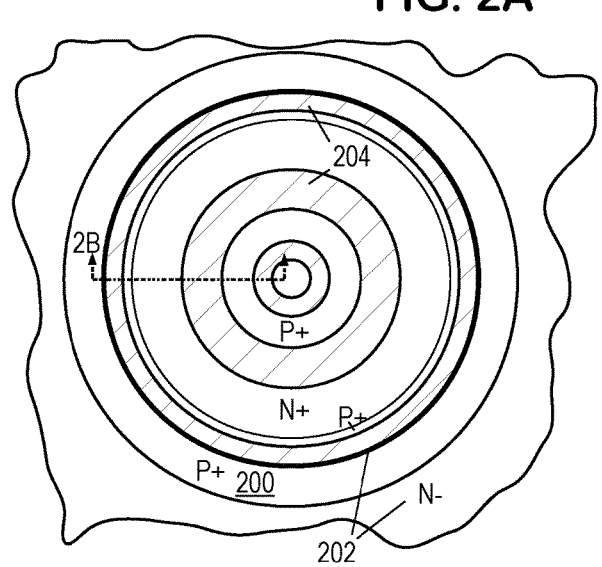
FIGS. 2A-2C are a plan view, a cross-section, and an equivalent circuit for an illustrative SCR structure.
Figure 2C:
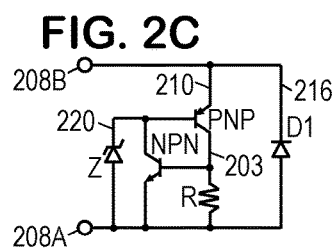
Figure 2B:
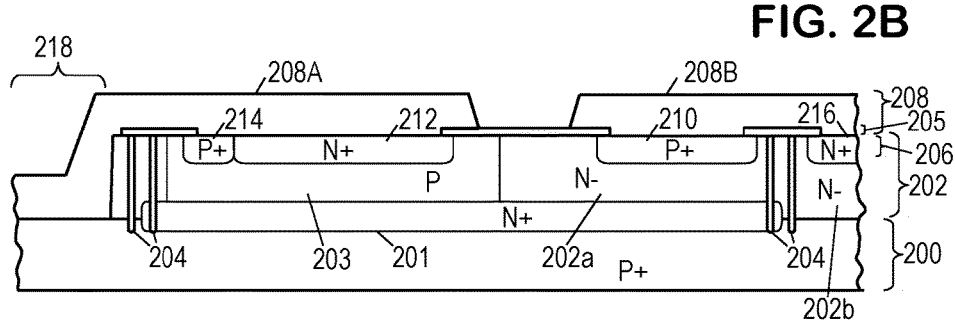

To provide ESD protection for this electronic circuitry, the devices 102 may include one or more integrated circuit (IC) structures for shunting ESD currents while limiting the associated voltages to tolerable levels. FIGS. 2A-2C are a plan view, a cross-section, and an equivalent circuit for an illustrative SCR structure that provides this functionality. For clarity, the plan view shown in FIG. 2A omits the metallization layer 208 described below, but includes the insulating layer 205 (shown with cross-hatching). Area 200 represents a portion of the substrate 100 within a given device 102. An epitaxial layer 202 is formed on the substrate 200. The illustrated layer 202 is formed as a circular "island", whether by masked deposition or by etching of a "moat" around the island.

Though illustrated as a circular structure having a ring-within-ring arrangement, the shape is of little importance. Rather, the operation of the structure is affected only by the absolute and relative areas of the boundaries between the semiconducting regions described below. Thus, other closed shapes such as polygons and rectangles, as well as "open" shapes such as rows and fractal trees, are contemplated. In each case, a cross-section line 2B may be drawn. FIG. 2B shows the resulting cross-section, with the "moat" on the left and the interior on the right.

Substrate 200 is shown as a heavily-doped p-type (P+) semiconductor, and may be, e.g., a 100- or 110-oriented silicon wafer. (Other substrate materials and dopings are also contemplated.) The precursor for a heavily-doped n-type (N+) buried layer 201, may be provided with a patterned implantation or diffusion of dopants on the substrate 200, which dopants later diffuse into the epitaxial layer 202 from below. Alternatively, epitaxial layer 202 may be formed in stages, with a patterned implantation or diffusion of dopants performed in an early stage to form the buried layer 201. The junction between the substrate 200 and buried layer 201 will serve as a Zener diode Z (FIG. 2C). Where the n-type (N−) epitaxial layer 202 abuts the p-type (P+) substrate 200 without an intermediate buried layer (on the right side of FIG. 2B), the junction will serve as a conventional diode D1 (FIG. 2C).

The bulk of the epitaxial layer 202 is a lightly-doped n-type (N−) semiconductor, preferably matching the substrate material. (In other words, if the substrate is silicon, the epitaxial layer is preferably silicon). A moderately-doped p-type well (P) 203 is formed within the bulk of the n-type (N−) epitaxial layer 202, thereby defining the central one of the three junctions of the SCR structure. The other two junctions of the SCR structure will be created with a shallow, heavily-doped p-type (P+) region 210 (aka anode 210) on the surface of the n-type (N−) epitaxial layer bulk 202a; and a shallow, heavily-doped n-type (N+) region 212 (aka cathode 212) on the surface of the p-type (P) well 203.

Before these and the other shallow regions are formed, however, one or more deep isolation trenches 204 may be etched to define the boundaries of the SCR structure. The isolation trenches 204 are filled with an oxide (e.g., $SiO_2$) or another insulating material. A blanket insulating layer 205 may be grown or deposited at the same time as, or subsequent to, the trench fill. The insulating layer 205 may then be patterned and etched as needed to form the shallow anode and cathode regions that complete the SCR structure. In addition, a degenerate or heavily-doped p-type (P+) region 214 may be provided on the surface of the p-type (P) well 203 to create a resistive connection R (FIG. 2C) between the p-type (P) well 203 and the ground terminal 208A. Also, a degenerate or heavily-doped n-type (N+) region 216 (aka cathode 216) may be provided on the surface of the n-type (N−) epitaxial layer bulk 202b (on the other side of the isolation trenches 204 from the SCR structure) to serve as a cathode contact for conventional diode D1.

Once the shallow regions have been formed, the insulating layer 205 may be stripped and replaced with another insulating layer having patterned openings for contact with the metallization layer 208. The metallization layer may be deposited and later etched to define the different terminals 208A, 208B. Suitable metallization layer materials include Al, AlSi, AlCu, Cu, Au, W, and combinations thereof provided in sub-layers. Ground terminal 208A connects to cathode 212, resistive region 214, and (via a deep trench 218, or "moat") the substrate 200. Pad terminal 208B connects to anode 210 and cathode 216.

FIG. 2C shows the resulting equivalent circuit, with the SCR structure represented by a trigger transistor (transistor PNP) and a latching transistor (transistor NPN) having the base of each transistor coupled to the collector of the other transistor. The emitter of the trigger transistor is the SCR anode 210, while the emitter of the latching transistor is the SCR cathode 212. Resistor R also couples the latching transistor's base 203 to the ground terminal. Diode D1 is coupled between the pad and ground terminals 208B, 208A to prevent reverse biasing. The base of trigger transistor PNP serves as a trigger node 220, which is coupled to the ground terminal via Zener diode Z.

It is noted that with the relatively low doping of the n-type (N−) epitaxial layer, the PN junctions it forms with p-type well 203 and p-type substrate 200 provide relatively wide depletion regions under normal operation, further minimizing any parasitic capacitance of the structure.

Figure 3:
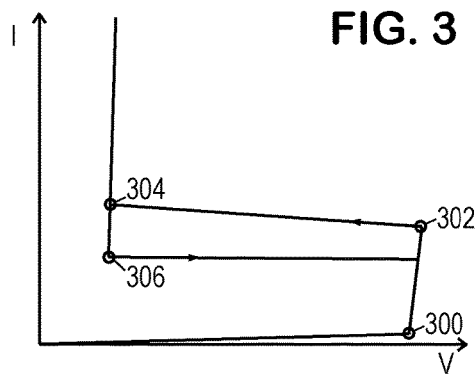
FIG. 3 is a graph of an illustrative current-voltage curve for an SCR-based ESD protection device.

Operation of the illustrative SCR structure of FIGS. 2A-2C will now be described with reference to FIG. 3, which shows a representative current-voltage curve for positive voltage differences between the pad and ground terminals 208B, 208A. (Behavior for negative voltage differences occurs in accordance with the conventional operation of diode D1, and need not be discussed in detail except to note that the diode D1 should be sized to handle any anticipated ESD currents of this polarity.) Before power is supplied to the structure, the voltage (and hence the current) is expected to be zero, so our discussion begins at the origin. As the device begins operating, the voltage on the pad terminal rises to a nominal value, e.g., a value typically in the range of about 0.8 to 3.3 volts. If the pad terminal is connected to a digital signaling line, the voltage may change rapidly between values that represent bits or other digital values. So long as the voltage remains below the voltage at the trigger point 300 (i.e., the trigger voltage), the small leakage current between the emitter and base of trigger transistor PNP is sufficient to keep a minimal voltage difference between the two, maintaining trigger transistor PNP in an "off" state (which also maintains latching transistor NPN in an "off" state, further minimizing the leakage current). An illustrative leakage current value below 1 microampere may be considered suitable.

However, once the pad terminal voltage exceeds the trigger voltage (e.g., due to an ESD), the Zener diode Z prevents the voltage at the base of trigger transistor PNP from following the emitter voltage. The Zener diode (or some other voltage limiting structure) can thus be used to set the trigger voltage at a desired value. A suitable range for the selected trigger voltage would be 5 to 10 volts.

With the Zener diode in a conduction mode, the leakage current begins to rise. The increasing emitter-base voltage also causes trigger transistor PNP to gradually begin conducting a current to the resistor R, further increasing current flow through the structure. With the increasing current through resistor R, the latching transistor NPN's base-emitter voltage difference begins increasing, causing the latching transistor to gradually begin conducting, further increasing the emitter-base voltage of trigger transistor PNP in a positive-feedback loop that enables a rapid increase in current through the device. The positive-feedback effect means that very little additional voltage (less than one volt) on the pad terminal is required to reach the breakover point 302, where the feedback loop causes both transistors to switch "on", greatly reducing the impedance of the structure.

As the transistors switch "on" the voltage drops to that of the snapback point 304 (i.e., the snapback voltage), enabling significantly larger currents to pass through at a greatly reduced voltage, typically one to three volts. Once the current begins to fall (e.g., due to depletion of the excess charge), the voltage on the pad terminal begins to drop as well, until the holding point 306 is reached. Holding point 306 represents the minimum voltage at which the transistors will sustain their "on" states. If the voltage or current drops from this point, the transistors will switch to their "off" states, causing the structure to operate at some lower voltage or lower current point along the curve.

Among the curve parameters of particular interest are the trigger voltage (often treated interchangeably with the breakover voltage), the leakage current below the trigger voltage, the snapback voltage, and the holding current. The first of these is readily adjustable with the Zener diode. The second of these is preferably minimized and techniques for this are discussed below. The snapback voltage is largely dictated by the design of the protected circuitry. The holding current involves a tradeoff between minimizing the holding current to provide maximum protection against ESD, and maximizing the holding current to reduce the risk of "latch-up". Latch-up is a condition in which the SCR structure fails to return to the "off" state after the ESD has dissipated. Latch-up becomes of particular concern in systems where the nominal current on the protected terminal is above the holding current, or where higher supply voltages or currents may induce parasitic currents in the device substrate. In such systems, latch-up prevents normal operation until the power is cycled, and can even lead to heating sufficient to damage the SCR structure. Accordingly, it is desirable to design the holding current at a level that minimizes the risk of latch-up while still being low enough to protect against ESD. In interfaces for HDMI 1.3/1.4 systems, for example, a holding current of at least 55 mA is desired, and 60 mA may be chosen as a design value. Techniques for achieving such holding current values are discussed further below.

Accordingly, three ESD protection device embodiments are now presented with reference to FIGS. 4A-4B, FIGS. 5A-5D, and FIG. 6, to demonstrate principles for improving performance relative to the device of FIGS. 2A-2C. The first ESD protection device embodiment shown in FIGS. 4A-4B shares much in common with the structure of FIGS. 2A-2C, as indicated by the use of the same element numbers 200-216. A comparison of FIGS. 2B and 4A reveals the introduction of a moderately-doped n-type (N) well 400 implanted and/or diffused within the bulk of n-type (N−) epitaxial layer 202, dividing bulk region 202a into two bulk regions 402a and 402b. Anode 210 is formed as a shallow, heavily-doped p-type (P+) region on the surface of well 400. The n-type (N) well 400 increases the carrier concentration in the base of transistor PNP, enabling the device dimensions to be reduced for faster switching. (For example, the width of bulk region 402a may be reduced to be within a range of 1 to 5 micrometers.) The width of p-type (P) well 203 is also decreased for further speed enhancement. Such decreases commensurately reduce the transit time of carriers through the base regions, enabling an SCR turn-on time of less than 1 ns, as opposed to about 20 ns typical of the structure of FIGS. 2A-2C. This enables the structure of FIGS. 4A-4B to operate quickly enough to prevent damage to certain high speed transceiver circuits that become vulnerable within the first 5 ns of an ESD pulse.

With the addition of the n-type (N) well 400, the junction profile for transistor PNP (regions 210, 400, 402a, and 203) can also be better customized to provide reduced current leakage, in part through the use of a more moderate gain value for transistor PNP. For example, 100 would be a suitable gain value, as contrasted with a typical gain in excess of 1000 for the structure of FIGS. 2A-2C. The current leakage is thus reducible by a factor of up to 100. The increased carrier concentration may also enable the structure to provide an increased holding current.

It is also desired to increase the protection device's holding voltage from about 1 volt to 2 volts to reduce the risk of latch-up. To achieve this gain, the device of FIGS. 4A-4B employs a second diode D2 in series with the coupled PNP and NPN transistor arrangement. (Compare FIGS. 2C and 4B.) The second diode D2 is created in three phases that are enumerated here, but need not be performed in the order given.

First, one or more deep isolation trenches 404 are etched and filled to separate the SCR region from the diode region. Illustrated trench 404 is positioned to divide n-type (N) well 400, as providing a portion of the well for use by the diode may provide for increased current carrying capacity, but this placement is optional. Second, a shallow, heavily-doped p-type (P+) region 406 is formed on the surface of n-type (N−) epitaxial bulk region 402b to serve as an anode for the diode D2. Third, a cathode is formed as a shallow, heavily-doped n-type (N+) region 408 on the surface of the epitaxial bulk region 402b and/or on the surface of the diode's portion of n-type well 400. A metallization layer trace serves as an intermediate node, connecting the cathode 408 of diode D2 to the anode 210 of the SCR.

Figure 4A:
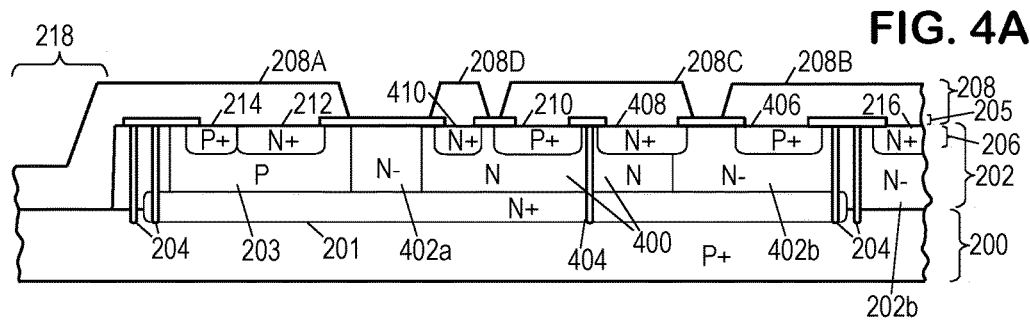
FIGS. 4A-4B are a cross-section and an equivalent circuit for a first ESD protection device embodiment.
Figure 4B:
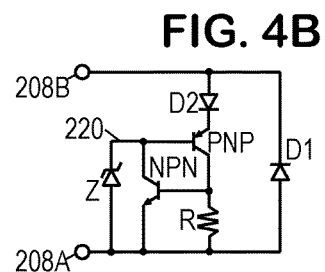

Added diode D2 thus includes anode 406, epitaxial layer bulk region 402b, a portion of n-type well 400, and cathode 408. FIG. 4A further shows a shallow, degenerate or heavily-doped n-type (N+) region 410 formed on the surface of n-type well 400 (the portion belonging to the SCR). Region 410 serves as a contact for an optional trigger terminal 208D, situated between the emitter and collector of the PNP transistor. The trigger terminal is not employed here, and other than the improvements described above, the operation of the device is similar to that of FIG. 2B.

A second ESD protection device embodiment is shown in FIGS. 5A-5C. FIG. 5A shows a plan view of the device, with a circular island 502 sharing the structure of FIG. 4A. A second island is also provided to serve as a trigger element 504. As with FIG. 2A, the metallization layer has been omitted for illustrative purposes.

FIG. 5B shows the cross-sectional view of FIG. 5A. As mentioned above, island 502 has the same structure as that of FIG. 4A. Separated from the island 502 by moat 218, the trigger element 504 also comprises a lightly-doped n-type (N−) epitaxial layer 505 on the heavily-doped p-type (P+) substrate 200 with an intervening heavily-doped n-type (N+) buried layer 506. (Note that in certain alternative embodiments, the trigger element 504 may abut or be part of island 502, so that it is encircled together with island 502 by the moat 218.) Isolation trenches 507 define the side boundaries of the trigger element 504. A moderately-doped p-type well 508 (denoted "P2" in FIG. 5B to distinguish from the SCR p-type well 203, shown here as "P1") is provided in the epitaxial layer 505 to serve as the base of a bipolar transistor within the trigger element 504. On the surface of the P2 well, a shallow, heavily-doped n-type (N+) region 510 is formed as the collector of the bipolar transistor. Another shallow, heavily-doped n-type (N+) region 512 may be concurrently formed on the surface of the epitaxial layer 505 to provide an emitter terminal for the bipolar transistor.

As no separate base terminal is provided for the bipolar transistor, region 510 further functions as the cathode of a Zener diode integrated into the structure of the bipolar transistor, as shown in FIG. 5C. This structure, designed to provide a low breakdown voltage, is termed a low voltage punch through ("LVPT") device 504. Device 504 is coupled between the trigger terminal 208D and the ground terminal 208A. The trace 514 connecting the trigger terminal 208D to the collector/anode region 510 may be routed within the metallization layer 208, or may be routed through an additional metallization layer.

The use of LVPT device 504 provides more customizable control of the trigger voltage. During ESD events, trigger device 504 will breakdown at a lower input voltage than the built-in Zener junction underlying the SCR. The trigger device will draw the breakdown current through the emitter-base junction of the PNP bipolar transistor of the SCR, thereby increasing the current flowing through the gate of the SCR. When this current exceeds the turn-on current of the SCR, the SCR will latch into an "on" state and carry the entirety of the ESD current. The lower voltage turn-on of the trigger device will lower the overall breakover voltage of the SCR device as compared to the self-triggered SCR of FIG. 4A.

FIG. 5D compares the FIG. 5B device response 542 to the FIG. 2B device response 544 for a 100 ns pulse of 8 amperes (to simulate an ESD). Notably, the resulting voltage drop across the FIG. 5B device falls more quickly to the snapback voltage of about 5 volts, the fall occurring within the desired 5 nanosecond window, as contrasted with the slower fall of the FIG. 2B device. Evidence of a comparable holding voltage can also be seen after the end of the 100 ns pulse.

We note here that a great deal of flexibility exists with respect to the design of trigger device 504. While the illustrated device is formed as bipolar structure of n-type surface regions cooperating with a p-type well, it could alternatively be formed as a bipolar structure of p-type surface regions cooperating with an n-type well, or as a Zener device having, as one example, an n-type surface region adjacent or overlapping a p-type surface region. Other suitable Zener device structures include an n-type surface region within a p-type well that forms the anode, or a p-type surface region within an n-type well that forms the cathode. Still other structures may be used, including a set of series-connected P-N diodes having the appropriate forward conduction voltage.

Figure 6:
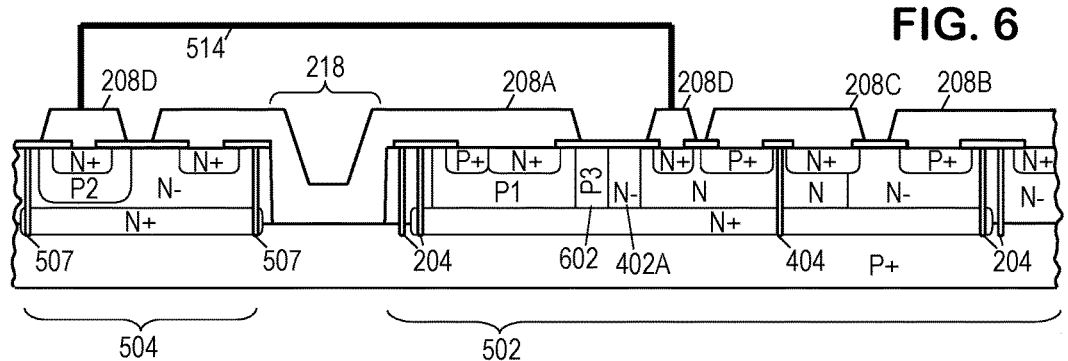
FIG. 6 is a cross-section for a third ESD protection device embodiment.

A third ESD protection device embodiment is shown in FIG. 6. It includes all of the same elements as the embodiment of FIG. 5B, but further includes an additional moderately-doped p-type well 602 (denoted "P3" in FIG. 6 to distinguish from the previously-discussed p-type wells P1 and P2). Though each of these wells is moderately doped, the exact dopant concentration of each well is treated as a design parameter that may be set independent of the other p-type wells. P-type (P3) well 602 modifies the gain of the NPN transistor portion of the SCR to increase the holding current of the SCR. When employed for HDMI 1.3/1.4 interfaces, for example, this region may be employed to raise the holding current above 55 mA to, for example, about 60 mA.

Figure 7:
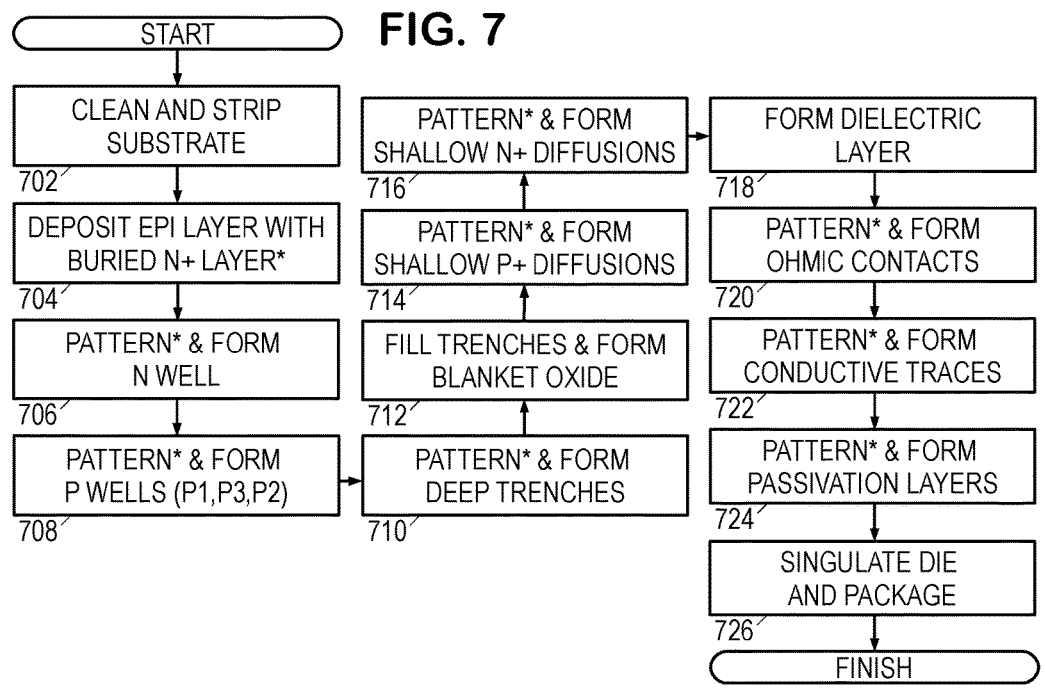
FIG. 7 is a flow diagram of an illustrative manufacturing method.

FIG. 7 is a flow diagram of an illustrative method for manufacturing the disclosed ESD protection devices. The method begins in block 702 with cleaning of the p-type (P+) substrate wafer and the stripping of the native oxide layer to expose the underlying semiconductor crystal. In block 704, a buried, heavily-doped n-type (N+) layer is patterned and formed as part of a deposited lightly-doped n-type (N−) epitaxial layer.

The patterning may be done with a conventional sequence of photoresist deposition, masked exposure to light to provide a "set" photoresist only over selected regions, and rinsing away of the unset photoresist, leaving a pattern of protected and unprotected surface regions. The unprotected regions then receive the desired deposition (or in some cases, etching) operations, while the photoresist over the protected regions prevents these regions from being affected. Any materials deposited on the photoresist are removed when the photoresist is stripped in preparation for subsequent operations. Those operations employing patterning are indicated with an asterisk in FIG. 7.

In block 706, a moderately-doped n-type (N) well 400 (See FIG. 4) is formed in the epitaxial layer. In block 708, a moderately-doped p-type (P1) well is formed in the epitaxial layer. Additional moderately-doped p-type wells (P2, P3) may also be formed in this block. In block 710, the isolation trenches are formed. In this block, the deep "moat" may also be formed as a deep trench. In block 712, the isolation trenches are filled with an insulating material, such as an oxide. A blanket oxide may also be grown over the top of the substrate at this time.

In blocks 714, the shallow, heavily-doped p-type regions are formed, using patterning and etch operations to penetrate the blanket oxide at the desired regions. The blanket oxide may then be stripped and regrown in preparation for block 716, where the shallow, heavily-doped n-type regions (N+) are formed using similar patterning and etch operations. The blanket oxide may be again stripped and replaced in block 718 with a layer of an impurity-free oxide or other dielectric material.

In block 720, the dielectric layer is patterned and etched to expose the contact regions for the terminals. Often, the contact regions will be degenerately doped to provide an ohmic contact, or perhaps provided with an interface material to avoid a rectifying junction with the metallization layer, which is patterned and deposited in block 722. In block 724, a passivation layer is provided, leaving windows for leads or solder balls to connect with the ground and pad terminals. The "moat" enables the ground terminal to contact the substrate's front side, enabling the use of flip-chip and chip-scale packaging techniques. In block 726, the dies are singulated and packaged to produce devices having integrated ESD protection. The devices may even be passive components packaged for the sole purpose of adding ESD protection to other components.

The foregoing method can be automated and embodied in a conventional semiconductor processing system or assembly line. Note that the order of operations in the foregoing method can be varied and still yield a structure that operates in accordance with the principles set forth herein.

Thus, this disclosure provides a monolithic silicon device for ESD protection with a low snapback voltage suitable for protecting the small geometry elements typical of advanced technology chips and with a fast response SCR device (able to switch within 5 ns), having an ultra-low input capacitance (below 0.3 pF for a typical application). Co-integrated trigger devices, such as LVPT devices, are disclosed for further control of the trigger (and hence, breakover) voltages. The use of an additional p-type well is further provided for adjustment of the device's holding current to values suitable for HDMI systems, and an added series diode provides a suitably higher holding voltage. Also disclosed is the use of a moderately-doped n-type well that, in addition to providing reduced leakage currents, enables the use of smaller dimensions for the device so that a greater number of such ESD protection devices may be integrated on a single die.

While the foregoing description has presumed the use of silicon as the semiconducting material, one of ordinary skill will recognize that the foregoing approach may also be employed with other semiconducting materials such as carbon, germanium, and gallium-arsenide. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A semiconductor device for protection against electrostatic discharge (ESD), the device comprising:
   a substrate, the substrate being a semiconductor of a first conductivity type;
   a lightly-doped epitaxial layer on the substrate with an intervening heavily-doped buried layer in at least one region, the epitaxial layer and buried layer having a second conductivity type different than the first; and
   a semiconductor-controlled rectifier (SCR) structure within said at least one region, the SCR structure including, between a ground terminal and a pad terminal:
      a first shallow region heavily-doped to be of the first conductivity type within a first well moderately-doped to be of the second conductivity type, the first shallow region and first well forming an emitter-base junction of a trigger transistor;
      a second shallow region heavily-doped to be of the second conductivity type within a second well moderately-doped to be of the first conductivity type, the second shallow region and second well forming an emitter-base junction of a latching transistor, wherein the first and second wells are separated by a lightly-doped portion of the epitaxial layer;
      a PN junction coupled to either the first or second shallow region as a series diode that is forward-biased for current flow from the pad terminal to the ground terminal to increase a holding voltage of the SCR structure; and
      a third well moderately-doped to be of the first conductivity type, the third well interposed between the second well and the lightly-doped portion of the epitaxial layer to enhance a holding current of the device.

2. The device of claim 1, wherein the at least one region is laterally bounded by one or more isolation trenches that extend through the buried layer to reach the substrate.

3. The device of claim 2, wherein a junction between the buried layer and the substrate serves as a Zener diode reverse-biased between the base of the trigger transistor and the substrate.

4. The device of claim 1, wherein the PN junction is formed by a third shallow region heavily-doped to be of the first conductivity type within a second portion of the epitaxial layer, the third shallow region being connected to the pad terminal, and wherein the second portion is coupled to the first shallow region by a conductive trace between the first shallow region and a fourth shallow region heavily doped to be of the second conductivity type.

5. The device of claim 4, further comprising an isolation trench between the first shallow region and the fourth shallow region, the isolation trench extending through the first well and the buried layer to reach the substrate.

6. The device of claim 1, wherein the SCR structure further includes a fifth shallow region heavily doped to be of the second conductivity type within the first well to serve as a trigger node, wherein the trigger node is coupled to a trigger element.

7. The device of claim 6, wherein the trigger element comprises a low-voltage punch-through (LVPT) device coupled between the trigger node and the ground terminal.

8. The device of claim 6, wherein a junction between the buried layer and the substrate serves as a first Zener diode reverse-biased between the base of the trigger transistor and the substrate, and wherein the trigger element comprises a second Zener diode having a breakdown voltage smaller than that of the first Zener diode.

9. The device of claim 6, wherein the trigger element is formed within a separate region of the lightly-doped epitaxial layer having an intervening buried layer with the substrate and bounded by one or more isolation trenches that extend through the buried layer to the substrate.

10. The device of claim 1, wherein the first conductivity type is p-type and second conductivity type is n-type.

11. The device of claim 1, wherein the first conductivity type is n-type and second conductivity type is p-type.

12. A method of providing improved ESD protection to a line that carries a line voltage and current, the method comprising:
   providing a reverse-biased diode that conducts if the line voltage falls below a ground terminal voltage; and
   providing an SCR structure that remains OFF until the line voltage exceeds a trigger voltage at which point it switches ON to clamp the line voltage at a snapback voltage below the trigger voltage, resetting only after the line current falls below a holding current or the line voltage falls below a holding voltage, the SCR structure providing a fast switching response with an ultra-low input capacitance and elevated holding voltage by way of a forward-biased diode in series with:
      a first shallow region heavily-doped to be of a first conductivity type within a first well moderately-doped to be of the second conductivity type, the first shallow region and first well forming an emitter-base junction of a trigger transistor;
      a second shallow region heavily-doped to be of the second conductivity type within a second well moderately-doped to be of the first conductivity type, the second shallow region and second well forming an emitter-base junction of a latching transistor; and
      an interposed epitaxial layer region lightly-doped to be of the first or second conductivity type and having a length of no more than five micrometers.

13. The method of claim 12, wherein the interposed epitaxial layer region has a length of less than two micrometers.

14. The method of claim 12, further comprising:
   including an integrated trigger element with the SCR structure, the trigger element being coupled to a fifth shallow region heavily doped to be of the second conductivity type within the first well.

15. The method of claim 14, wherein the trigger element provides a reduced trigger voltage by way of a low-voltage punch-through (LVPT) device coupled between the fifth shallow region and the ground terminal.

16. The method of claim 14, wherein the interposed epitaxial layer is buffered from a heavily-doped substrate of a first conductivity type by a buried layer heavily-doped to be of a second conductivity type, the junction between the buried layer and the substrate serving as a first Zener diode reverse-biased between the base of the trigger transistor and the substrate, and wherein the trigger element comprises a second Zener diode having a breakdown voltage smaller than that of the first Zener diode.

17. The method of claim 12, wherein the SCR structure further provides an elevated holding current by way of a third well moderately-doped to be of the first conductivity type, the third well interposed between the second well and the interposed epitaxial layer region, the interposed epitaxial layer region lightly-doped to be of the second conductivity type.

18. The method of claim 12, wherein the first conductivity type is p-type and second conductivity type is n-type.

19. The method of claim 12, wherein the first conductivity type is n-type and second conductivity type is p-type.

\* \* \* \* \*